US009793130B2

(12) United States Patent
Sato et al.

(10) Patent No.: US 9,793,130 B2
(45) Date of Patent: Oct. 17, 2017

(54) METHOD FOR PROCESSING OBJECT TO BE PROCESSED

(71) Applicants: TOKYO ELECTRON LIMITED, Tokyo (JP); Takeshi Sakuma, Tokyo (JP)

(72) Inventors: Jun Sato, Miyagi (JP); Eiichi Nishimura, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/319,101

(22) PCT Filed: Jul. 10, 2015

(86) PCT No.: PCT/JP2015/069861
§ 371 (c)(1),
(2) Date: Dec. 15, 2016

(87) PCT Pub. No.: WO2016/013418
PCT Pub. Date: Jan. 28, 2016

(65) Prior Publication Data
US 2017/0133233 A1    May 11, 2017

(30) Foreign Application Priority Data

Jul. 25, 2014  (JP) ................................ 2014-151914

(51) Int. Cl.
*H01L 21/3065*  (2006.01)
*H01L 43/08*  (2006.01)
(Continued)

(52) U.S. Cl.
CPC ........ *H01L 21/3065* (2013.01); *H01L 27/105* (2013.01); *H01L 27/222* (2013.01);
(Continued)

(58) Field of Classification Search
CPC . H01L 21/3065; H01L 27/105; H01L 27/222; H01L 43/08; H01L 43/10; H01L 43/12
See application file for complete search history.

(56) References Cited

U.S. PATENT DOCUMENTS

2004/0137749 A1* 7/2004 Ying ..................... H01L 43/12
                                                            438/710

FOREIGN PATENT DOCUMENTS

JP    2014-049466 A    3/2014

OTHER PUBLICATIONS

International Search Report issued in PCT/JP2015/069861; dated Oct. 13, 2015.

* cited by examiner

*Primary Examiner* — Karen Kusumakar
(74) *Attorney, Agent, or Firm* — Studebaker & Brackett PC

(57) ABSTRACT

In a method according to one embodiment, a first processing gas is supplied into a processing container of a plasma processing apparatus, and a plasma of the first processing gas is generated to etch an upper magnetic layer by the plasma of the first processing gas. Subsequently, a deposit, which is generated due to the etching of the upper magnetic layer, is removed. The removal of the deposit includes allowing a reduction reaction to occur in the deposit by a plasma of a second processing gas that contains $H_2$ gas, and removing a product, which is generated by the reduction reaction, by using a third processing gas that contains hexafluoroacetylacetone.

6 Claims, 10 Drawing Sheets

(51) Int. Cl.
*H01L 43/12* (2006.01)
*H01L 27/105* (2006.01)
*H01L 27/22* (2006.01)
*H01L 43/10* (2006.01)

(52) U.S. Cl.
CPC .............. *H01L 43/08* (2013.01); *H01L 43/10* (2013.01); *H01L 43/12* (2013.01)

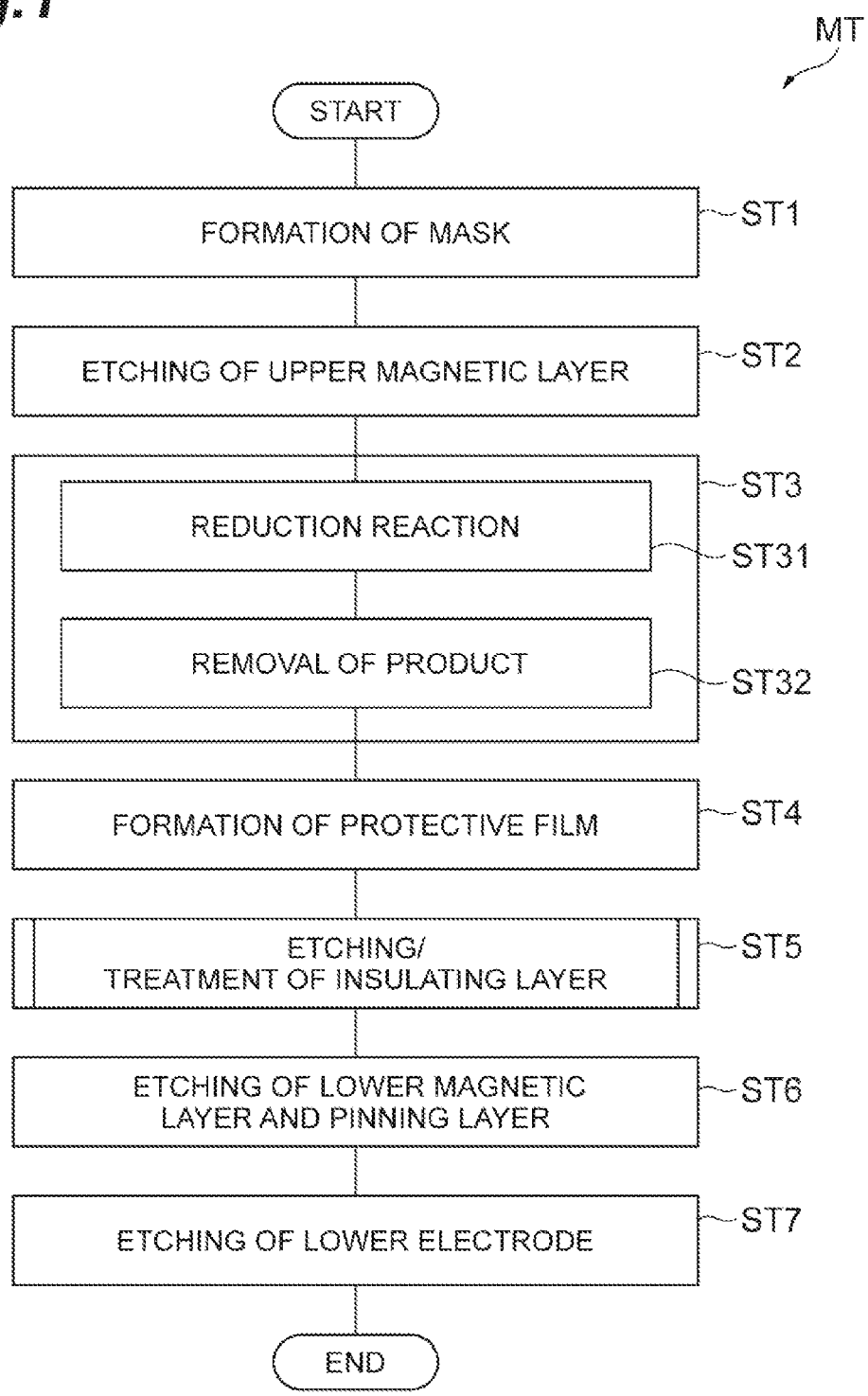

METHOD FOR PROCESSING OBJECT TO BE PROCESSED

TECHNICAL FIELD

Embodiments of the invention relate to a method for processing a workpiece.

BACKGROUND ART

A magnetic random access memory (MRAM) element is a memory having a magnetic tunnel junction (MTJ), and includes two magnetic layers, and an insulating layer provided between the magnetic layers. The magnetic layers are formed of a metal such as Co and/or Fe.

In manufacturing the magnetic random access memory, etching is performed to transfer a mask pattern to the two magnetic layers and the insulating film. In the etching, a reaction product, which is less likely to vaporize, is generated, and the reaction product is deposited on the workpiece. The reaction product may cause various problems such as a leakage current of the MRAM element, and thus it is necessary to remove the reaction product.

A method for removing the reaction product is described in Patent Literature 1. In the method described in Patent Literature 1, first, an upper magnetic layer out of the two magnetic layers, that is, out of a lower magnetic layer and an upper magnetic layer is etched by a plasma of a processing gas that contains a halogen. Subsequently, a protective film is formed on a surface of the workpiece. Subsequently, the insulating layer is etched. Then, a reaction product is removed by a processing gas that contains $PF_3$ gas.

CITATION LIST

Patent Literature

[Patent Literature 1] Japanese Patent Application Laid-Open publication No. 2014-49466

SUMMARY OF INVENTION

Technical Problem

A reaction product, that is, a deposit is also formed on the workpiece due to the etching of the upper magnetic layer. However, the method described in Patent Literature 1 performs only removal of the reaction product that is formed due to the etching of the insulating layer, and does not perform removal of the deposit that is formed due to the etching of the upper magnetic layer. However, it is also necessary to remove the deposit that is formed due to the etching of the upper magnetic layer.

Solution to Problem

According to one aspect, there is provided a method for processing a workpiece. The workpiece includes a lower magnetic layer, an insulating layer provided on the lower magnetic layer, an upper magnetic layer provided on the insulating layer, and a mask provided on the upper magnetic layer. The method includes (a) a step (hereinafter, referred to as "step a") of etching the upper magnetic layer, the step a including supplying a first processing gas into a processing container of a plasma processing apparatus, and generating a plasma of the first processing gas to etch the upper magnetic layer by the plasma of the first processing gas; and (b) a step (hereinafter, referred to as "step b") of removing a deposit that is formed on the workpiece due to the step a. The step b includes (b1) allowing a reduction reaction to occur in the deposit by a plasma of a second processing gas that contains $H_2$ gas, and (b2) removing a product, which is generated by the reduction reaction, by using a third processing gas that contains hexafluoroacetylacetone. In one embodiment, the upper magnetic layer may contain CoFeB.

The deposit, which is formed due to etching of the upper magnetic layer in the step a, may contain a metal oxide. The metal oxide is formed due to a reaction between a metal contained in the upper magnetic layer and oxygen. It is thought that oxygen is generated from a layer that is included in the workpiece, or various parts of a plasma processing apparatus. In the method according to the aspect, a reduction reaction is allowed to occur in the deposit by a plasma of the second processing gas that contains $H_2$ gas. A product, which is obtained from the deposit by the reduction reaction, can be removed by the third processing gas that contains hexafluoroacetylacetone. Therefore, according to the method, it is possible to remove a deposit that is formed due to etching of the upper magnetic layer.

In one embodiment, the step a and the step b may be alternately repeated. According to this embodiment, it is possible to prevent generation of a large amount of deposit through repetition of the step a and the step b, and it is possible to remove a deposit that is generated due to etching in the step a.

In one embodiment, the second processing gas further may contain $N_2$ gas. In this embodiment, since $N_2$ gas is contained in the second processing gas, it is possible to stably generate a plasma of the second processing gas.

In one embodiment, the third processing gas may contain $H_2O$. According to this embodiment, it is possible to promote a reaction between a product that is obtained by the reduction reaction, and hexafluoroacetylacetone.

In one embodiment, the method may further include a step of etching an insulating layer. The step of etching the insulating layer includes supplying a fourth processing gas into the processing container of the plasma processing apparatus, and generating a plasma of the fourth processing gas to etch the insulating layer by the plasma of the fourth processing gas.

Advantageous Effects of Invention

As described above, it is possible to remove a deposit that is formed due to etching of a magnetic layer.

BRIEF DESCRIPTION OF DRAWINGS

FIG. 1 is a flowchart illustrating a method for processing a workpiece according to one embodiment.

DESCRIPTION OF EMBODIMENTS

Figure 2A:
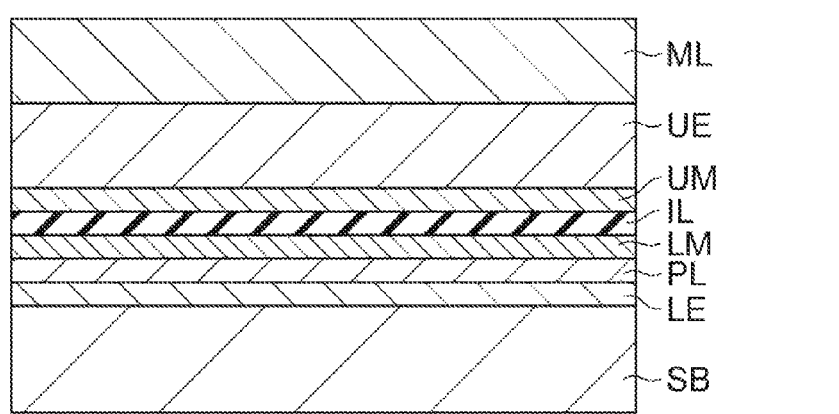
FIG. 2A is a cross-sectional view illustrating an example of the workpiece to which the method illustrated in FIG. 1 is applied.

Hereinafter, various embodiments will be described in detail with reference to the accompanying drawings. In the drawings, the same or equivalent portions are denoted by the same reference numerals or signs.

FIG. 1 is a flowchart illustrating a method for processing a workpiece according to one embodiment. A method MT illustrated in FIG. 1 is a method that can be used for manufacturing of a magnetic random access memory (MRAM) element, and includes at least a step ST2 of etching an upper magnetic layer, and a step ST3 of removing a deposit. In one embodiment, the method MT further includes a step ST1, and steps ST4 to ST7 in addition to the steps ST2 and ST3.

Figure 2B:
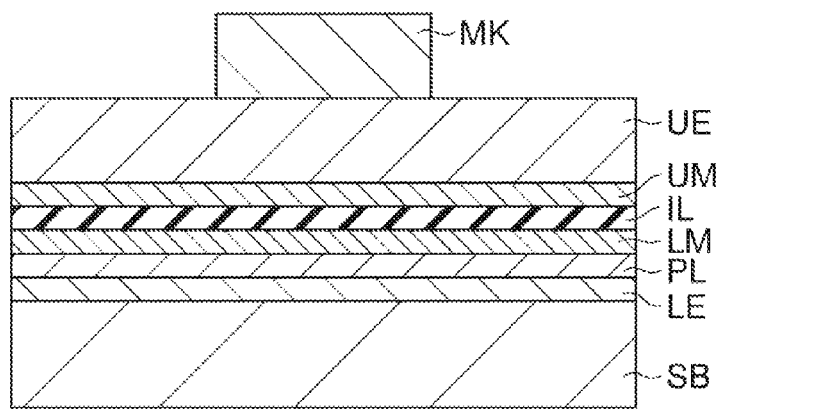
FIGS. 2B and 2C are cross-sectional views illustrating states of the workpiece after execution of respective steps in the method illustrated in FIG. 1.
Figure 2C:
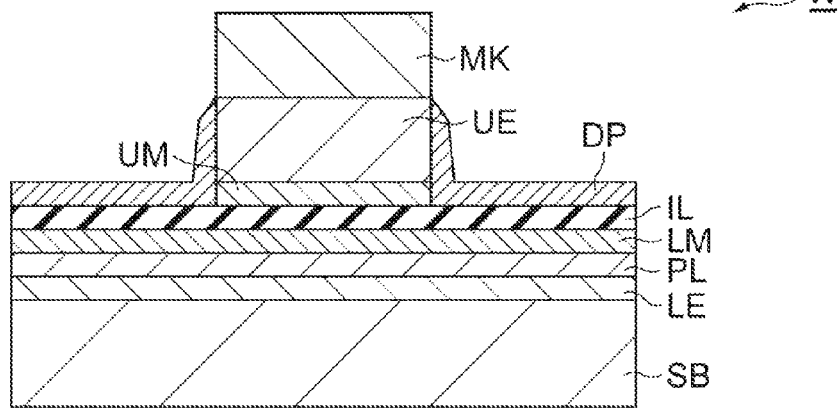

FIG. 2A is a cross-sectional view illustrating an example of the workpiece to which the method illustrated in FIG. 1 is applied, and FIGS. 2B and 2C are cross-sectional views illustrating states of the workpiece after execution of respective steps in the method illustrated in FIG. 1. As illustrated in FIG. 2A, the workpiece (hereinafter, referred to as "wafer W"), to which the method MT is applied, includes a substrate SB, a lower electrode layer LE, a pinning layer PL, a lower magnetic layer LM, an insulating layer IL, an upper magnetic layer UM, an upper electrode layer UE, and a mask layer ML.

The lower electrode layer LE is a layer formed of a conductive electrode material and is provided on the substrate SB. For example, the thickness of the lower electrode layer LE is approximately 5 nm. The pinning layer PL is provided between the lower electrode layer LE and the lower magnetic layer LM. The pinning layer PL in the MRAM element functions as a layer that fixes a magnetization direction of the lower magnetic layer LM by a pinning effect due to an antiferromagnetic substance. For example, the pinning layer PL is formed of an antiferromagnetic material such as iridium manganese (IrMn) and platinum manganese (PtMn), and the thickness of the pinning layer PL is, for example, approximately 7 nm.

The lower magnetic layer LM is a layer that contains a ferromagnetic substance, and is provided on the pinning layer PL. The lower magnetic layer LM is a layer that functions as a so-called pinned layer. That is, in the MRAM element, a magnetization direction of the lower magnetic layer LM is not affected by an external magnetic field and is constantly maintained by the pinning effect due to the pinning layer PL. For example, the lower magnetic layer LM is formed of CoFeB, and the thickness of the lower magnetic layer LM is, for example, approximately 2.5 nm.

The insulating layer IL is provided between the lower magnetic layer LM and the upper magnetic layer UM. The insulating layer IL in the MRAM element constitutes a magnetic tunnel junction (MTJ). In the magnetic tunnel junction (MTJ) of the MRAM element, the insulating layer IL is interposed between the lower magnetic layer LM and the upper magnetic layer UM, and thus tunnel magnetoresistance (TMR) is generated between the lower magnetic layer LM and the upper magnetic layer UM. That is, electrical resistance in accordance with a relative relationship (parallel or antiparallel) of the magnetization direction of the lower magnetic layer LM and the magnetization direction of the upper magnetic layer UM is generated between the lower magnetic layer LM and the upper magnetic layer UM. The insulating layer IL is formed of $Al_2O_3$ or MgO, and the thickness of the insulating layer IL is, for example, 1.3 nm.

The upper magnetic layer UM is a layer that contains a ferromagnetic substance, and is provided on the insulating layer IL. The upper magnetic layer UM in the MRAM element is a layer that functions as a so-called free layer. That is, in the MRAM element, a magnetization direction of the upper magnetic layer UM conforms to an external magnetic field that is magnetic information. For example, the upper magnetic layer UM is formed of CoFeB, and the thickness of the upper magnetic layer UM is, for example, approximately 2.5 nm.

The upper electrode layer UE is a layer that is formed of a conductive electrode material. For example, the upper electrode layer UE may be formed of Ta. The mask layer ML is a layer that is a base of a mask for etching the upper electrode layer UE and the upper magnetic layer UM. For example, the mask layer ML may be formed with a first layer that contains amorphous carbon and a second layer that contains $SiO_2$. The second layer is provided on the upper electrode layer UE and the first layer is provided on the second layer.

Referring to FIG. 1 again, description will be given of respective steps in the method MT. Hereinafter, FIG. 3A, FIG. 3B, FIG. 4A, FIG. 4B, FIG. 4C, FIG. 5A, and FIG. 5B will be appropriately referenced in addition to FIG. 1. FIG. 3A, FIG. 3B, FIG. 4A, FIG. 4B, FIG. 4C, FIG. 5A, and FIG. 5B are cross-sectional views illustrating states of a workpiece after execution of respective steps in the method illustrated in FIG. 1. As illustrated in FIG. 1, in the method MT, first, a step ST1 is executed. In the step ST1, as illustrated in FIG. 2B, a mask MK is formed from the mask layer ML. The mask MK can be formed by providing a patterned mask on the first layer and sequentially etching the first layer and the second layer of the mask layer ML. The first layer can be etched by a plasma of a processing gas that contains $O_2$ gas, and the second layer can be etched by a plasma of a processing gas that contains fluorocarbon gas.

In the subsequent step ST2, the upper magnetic layer UM is etched. In the step ST2 of one embodiment, the upper electrode layer UE and the upper magnetic layer UM are collectively etched. In the step ST2, a processing gas A (first processing gas) is supplied into a processing container of a plasma processing apparatus. The processing gas A may contain a halogen. In addition, the processing gas A may further contain a rare gas. For example, the processing gas A contains $SF_6$ gas and Ar gas. In the step ST2, a plasma of the processing gas A is generated. In the step ST2, a wafer W is exposed to the plasma of the processing gas A. Thereby, as illustrated in FIG. 2C, the upper electrode layer UE and the upper magnetic layer UM are etched, and a pattern of the mask MK is transferred to the upper electrode layer UE and the upper magnetic layer UM.

When the upper magnetic layer UM is etched by the step ST2, a deposit DP is formed on the wafer W, as illustrated in FIG. 2C. Specifically, the deposit DP is formed on a lateral surface of the upper electrode layer UE, a lateral surface of the upper magnetic layer UM, and a surface of the insulating layer IL. The deposit DP contains oxides of Co and Fe which are contained in the upper magnetic layer UM. It is thought that the oxides of Co and Fe in the deposit DP are derived from oxidation of Co and Fe due to oxygen that is generated from $SiO_2$ contained in the mask MK, or various parts of the plasma processing apparatus.

Figure 3A:
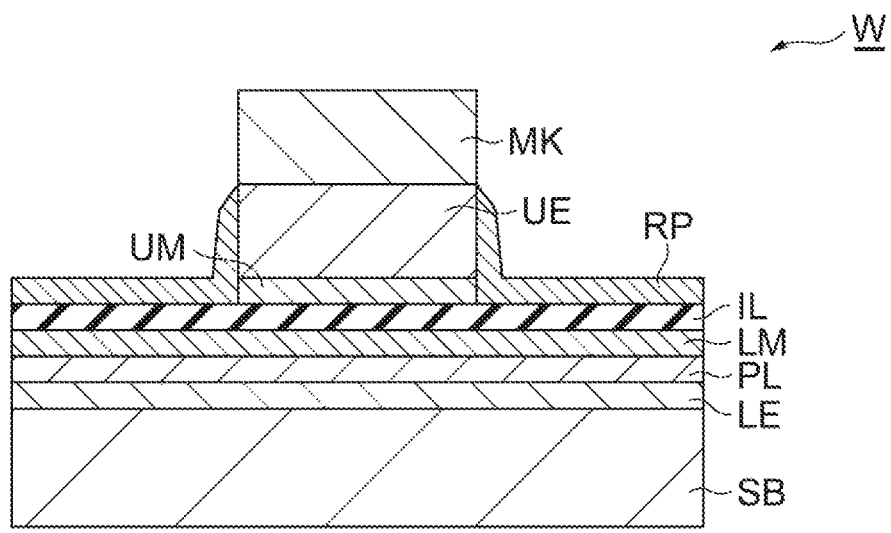
FIGS. 3A and 3B are cross-sectional views illustrating states of the workpiece after execution of respective steps in the method illustrated in FIG. 1.

In the method MT, subsequently, a step ST3 is executed to remove the deposit DP. The step ST3 includes a step ST31 and a step ST32. In the step ST31, a process of allowing a reduction reaction to occur in the deposit is performed. In the step ST31, a processing gas B (second processing gas) that contains an $H_2$ gas is supplied into a processing container of a plasma processing apparatus. Then, a plasma of the processing gas B is generated. In the step ST31, the wafer W is exposed to the plasma of the processing gas B. Thereby, a reduction reaction of the deposit DP occurs, and a product RP is generated from the deposit DP, as illustrated in FIG. 3A. Specifically, oxygen is removed from the oxides of Co and Fe in the deposit DP, and the product RP that contains Co and Fe is obtained.

In one embodiment, the processing gas, which is used in the step ST31, may contain $N_2$ gas in addition to the $H_2$ gas. In this embodiment, it is possible to stably generate a plasma of the second processing gas.

In the subsequently step ST32, a processing gas C (third processing gas), which contains hexafluoroacetylacetone, is supplied into a processing container that accommodates the wafer W, in order to remove the product RP. Here, the hexafluoroacetylacetone is 1,1,1,5,5,5-hexafluoroacetylacetone (hereinafter, referred to as "hfacH"). In one embodiment, the processing gas C may contain $H_2O$ and/or $O_2$ gas. In the step ST32, Co and Fe, which are contained in the product RP, are complexed by hfac. hfac is a hexafluoroacetylacetonate ligand that is generated when hydrogen (H) is detached from hfacH and hfacH becomes a monovalent anion. For example, as illustrated in the following reaction formula, a complex of Co is formed from Co in the product RP.

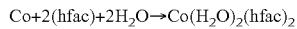

Co+2(hfac)+2H$_2$O→Co(H$_2$O)$_2$(hfac)$_2$

Figure 3B:
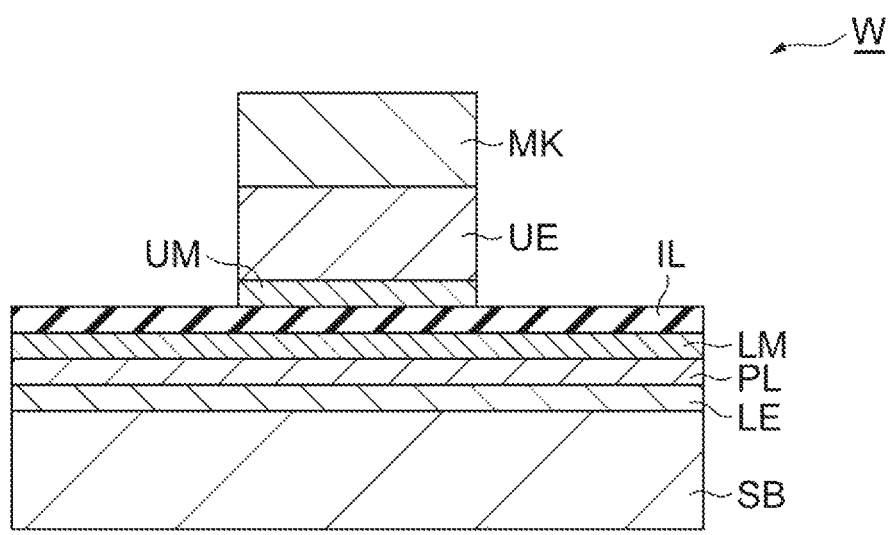

In the step ST32, the complex, which is generated as described above, is removed. As a result, the product RP is removed, as illustrated in FIG. 3B. In a case where $H_2O$ is contained in the processing gas C, it is possible to promote a reaction between the product RP and hfac. That is, $H_2O$ is added to the processing gas C to promote the reaction in the reaction formula and to easily generate a complex of Co and hafc.

In one embodiment, the step ST2 and the step ST3 may be alternately repeated. According to this embodiment, the upper magnetic layer UM is partially etched in the step ST2, and a relatively small amount of deposit DP, which is generated due to the step ST2, is removed in the step ST3. As described above, when the step ST2 and the step ST3 are alternately repeated, it is possible to prevent generation of a large amount of deposit DP and it is possible to remove the deposit DP that is generated due to the etching in the step ST2.

Figure 4A:
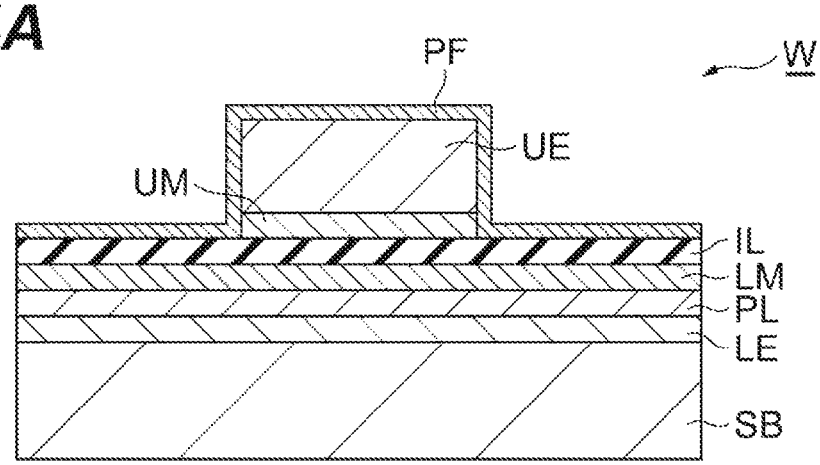
FIGS. 4A, 4B and 4C are cross-sectional views illustrating states of the workpiece after execution of respective steps in the method illustrated in FIG. 1.

Subsequently, in the method MT, a step ST4 is executed. In the step ST4, the wafer W is transferred to a film forming apparatus. Then, as illustrated in FIG. 4A, a protective film PF is formed on a surface of the wafer W. For example, the protective film PF is formed of by SiN or $SiO_2$. Furthermore, in FIG. 4A, the mask MK is omitted. The mask MK may be removed during execution of a step subsequent to the step ST4, or may be removed before execution of the step ST4.

Figure 6:
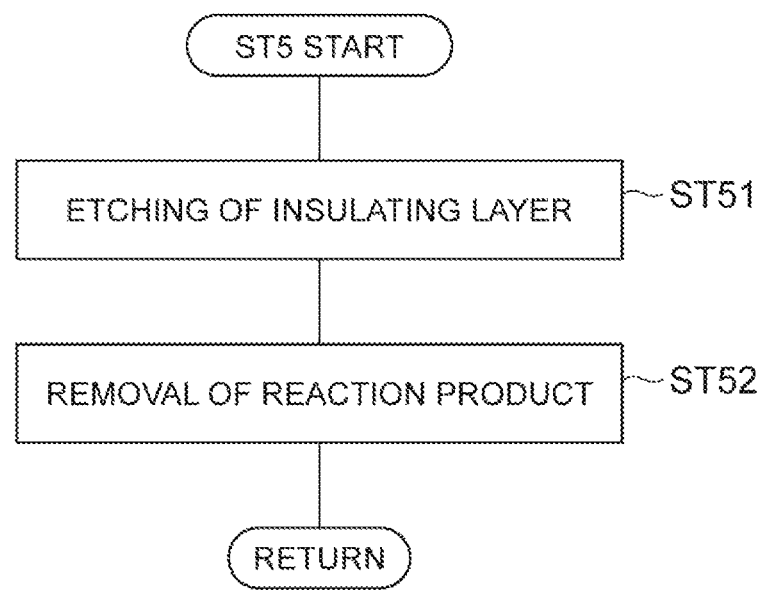
FIG. 6 is a flowchart illustrating details of the step ST5 illustrated in FIG. 1.

Subsequently, in the method MT, a step ST5 is executed. FIG. 6 is a flowchart illustrating details of the step ST5 illustrated in FIG. 1. As illustrated in FIG. 6, the step ST5 includes a step ST51, and a step ST52. In the step ST51, a processing gas D (fourth processing gas) is supplied into a processing container of a plasma processing apparatus, and a plasma of the processing gas D is generated. When the wafer W is exposed to the plasma, in a region that is not covered with the upper electrode layer UE, the upper magnetic layer UM, and the protective film PF, the insulating layer IL is etched.

The processing gas D, which is used in the step ST51, is a dissociative gas that dissociates by a plasma generated by a plasma source and generates radicals. The radicals may be radicals that cause a reduction reaction, an oxidation reaction, a chlorination reaction or a fluorination reaction. The processing gas D may be a gas that contains a hydrogen element, an oxygen element, a chlorine element, or a fluorine element. Specifically, the processing gas D may contains Ar, $N_2$, $O_2$, $H_2$, He, $BCl_3$, $Cl_2$, $CF_4$, $NF_3$, $CH_4$, $SF_6$, or the like. In a more specific example, the processing gas D may contain $O_2$ gas, Ar gas, $H_2$ gas, $Cl_2$ gas, and $NF_3$ gas.

Figure 4B:
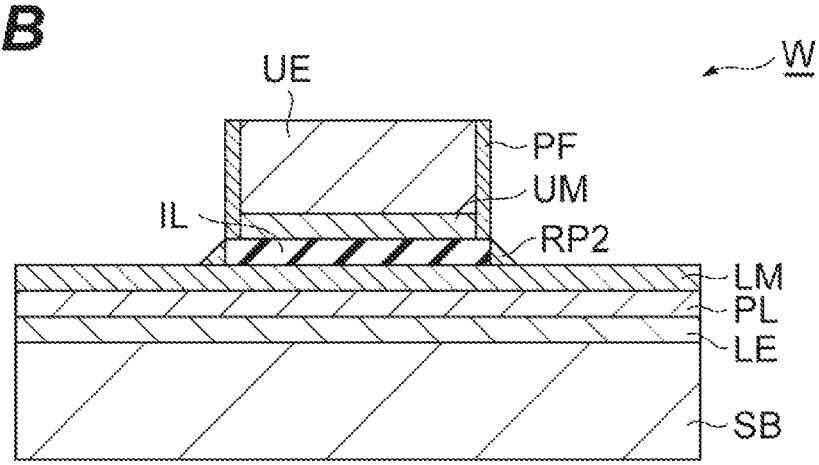

When the insulating layer IL is etched by a plasma of the processing gas, a reaction product RP2 is generated, as illustrated in FIG. 4B. The reaction product RP2 may contain a metal that is contained in the upper electrode layer UE, the protective film PF, and the insulating layer IL, an oxide, a chloride, a nitride, and a halide of the metal, a compound that contains C or Si, or the like. As illustrated in FIG. 4B, the reaction product RP2 is attached to a lateral surface of a feature obtained by etching, and/or a surface of the lower magnetic layer LM. The reaction product RP2, which is formed as described above, degrades verticality of a feature that is obtained by the subsequent etching. In addition, the reaction product RP2 contains a conductive material. Accordingly, when the reaction product RP2 remains, the reaction product RP2 may become a cause for a leakage current in the MRAM element.

According to this, in the subsequent step ST52, a treatment process, which uses an etching gas that contains $PF_3$, is performed. In the step ST52, a processing gas E is supplied into the processing container of the same plasma processing apparatus as in the step ST51. The processing gas E is a reactive gas for reaction with a reaction product without exposure to plasma. For example, the processing gas E may contain a gas in which the reaction with the reaction product depends on a temperature of a loading stage 110. Specifically, as the processing gas E, HF, $Cl_2$, HCl, $H_2O$, $PF_3$, $F_2$, $ClF_3$, $COF_2$, cyclopentadiene, amidinato, or the like can be used.

In addition, the processing gas E may contain an electron-donating gas. Typically, the electron-donating gas is a gas constituted by atoms which are greatly different from each other in electronegativity or an ionization potential, or a gas that contains atoms having a lone pair. The electron-donating gas has a property of being likely to donate an electron to another compound. For example, the electron-donating gas has a property of being coupled to a metal compound as a ligand, and evaporating. Examples of the electron-donating gas include a gas such as $SF_6$, $PH_3$, $PF_3$, $PCl_3$, $PBr_3$, $PI_3$, $CF_4$, $AsH_3$, $SbH_3$, $SO_3$, $SO_2$, $H_2S$, $SeH_2$, $TeH_2$, $Cl_3F$, $H_2O$, or $H_2O_2$, or a gas containing a carbonyl group. As a more specific example, the processing gas E may contain $PF_3$ gas.

Figure 4C:
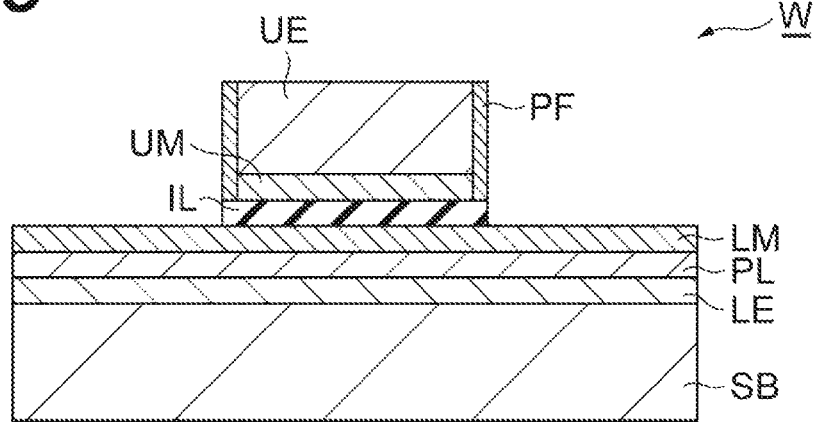

When the wafer W is exposed to the processing gas E, for example, a compound of $PF_3$ contained in the processing gas E, and a metal contained in the reaction product RP2 is formed. The compound vaporizes at a relatively low temperature. Accordingly, the compound can be easily exhausted. This step ST52 enables the reaction product RP2 to be removed, as illustrated in FIG. 4C.

It should be noted that the $PF_3$ gas may be contained in the processing gas that is used in one or both of the step ST51 and the step ST52. In addition, the step ST51 and the step ST52 may be alternately repeated.

Figure 5A:
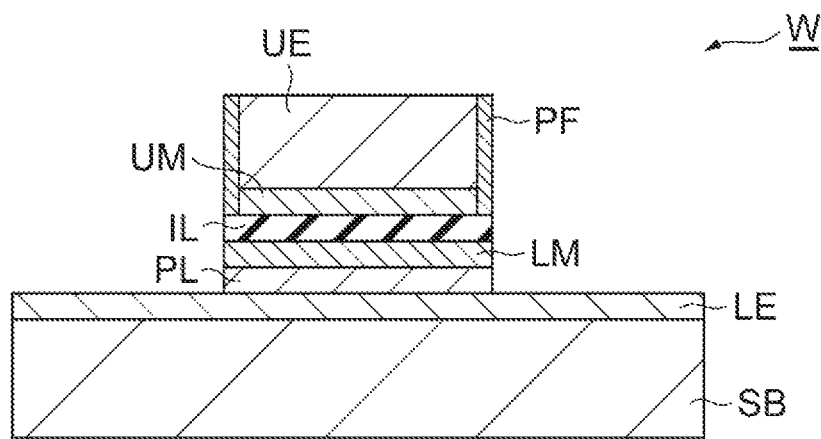
FIGS. 5A and 5B are cross-sectional views illustrating states of the workpiece after execution of respective steps in the method illustrated in FIG. 1.

In the subsequent step ST6, the lower magnetic layer LM and the pinning layer PL are etched. In the step ST6, a processing gas, which contains $CH_4$, is supplied into a processing container of a plasma processing apparatus. The processing gas F may contain a gas other than methane. Examples of the gas, which is contained, include an inert gas such as He, $N_2$, or Ar, and/or a gas that contains a carbonyl group, $H_2$, or the like. Then, a plasma of the processing gas F is generated, and the wafer W is exposed to the plasma. Thereby, in a region that is not covered with the upper electrode layer UE, the upper magnetic layer UM, and the protective film PF, the lower magnetic layer LM and the pinning layer PL are etched, as illustrated in FIG. 5A.

Figure 5B:
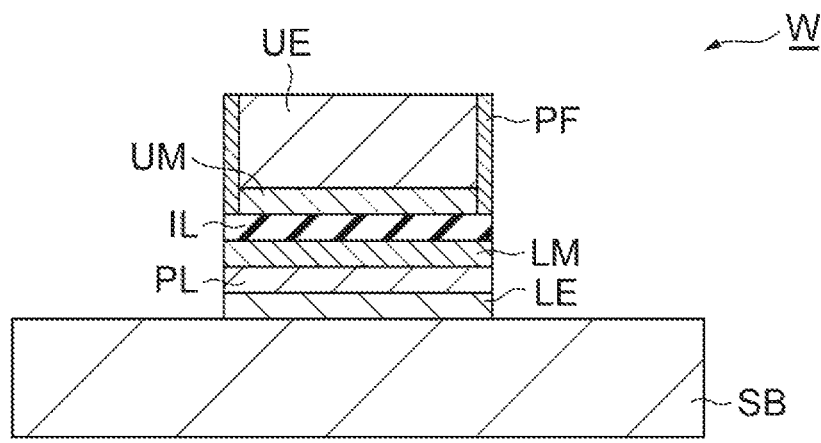

In the subsequent step ST7, the lower electrode layer LE is etched. In the step ST7, a processing gas G is supplied into a processing container of a plasma processing apparatus. The processing gas G may contain an inert gas such as He, $N_2$, or Ar, and/or a gas that contain a carbonyl group, $CH_4$, $H_2$, or the like. Then, a plasma of the processing gas G is generated, and the wafer W is exposed to the plasma. Thereby, as illustrated in FIG. 5B, in a region that is not covered with the upper electrode layer UE and the upper magnetic layer UM, the lower electrode layer LE is etched, and thus the MRAM element is formed.

According to the method MT, the reduction reaction is allowed to occur in the deposit DP by a plasma of the processing gas B that contain $H_2$ gas. The product RP, which is obtained from the deposit DP due to the reduction reaction, can be removed by the processing gas C that contains hexafluoroacetylacetone. Therefore, according to the method, it is possible to remove the deposit DP that is formed due to etching of the upper magnetic layer UM, as illustrated in FIG. 3B. It should be noted that, in a case where the processing gas that can be used in the step ST31 does not contain the $H_2$ gas, the reduction reaction does not occur. Accordingly, even when the wafer is exposed to the processing gas C in the step ST32, a substantial change from a state illustrated in FIG. 2C does not occur, and thus the deposit DP is not removed.

Figure 7:
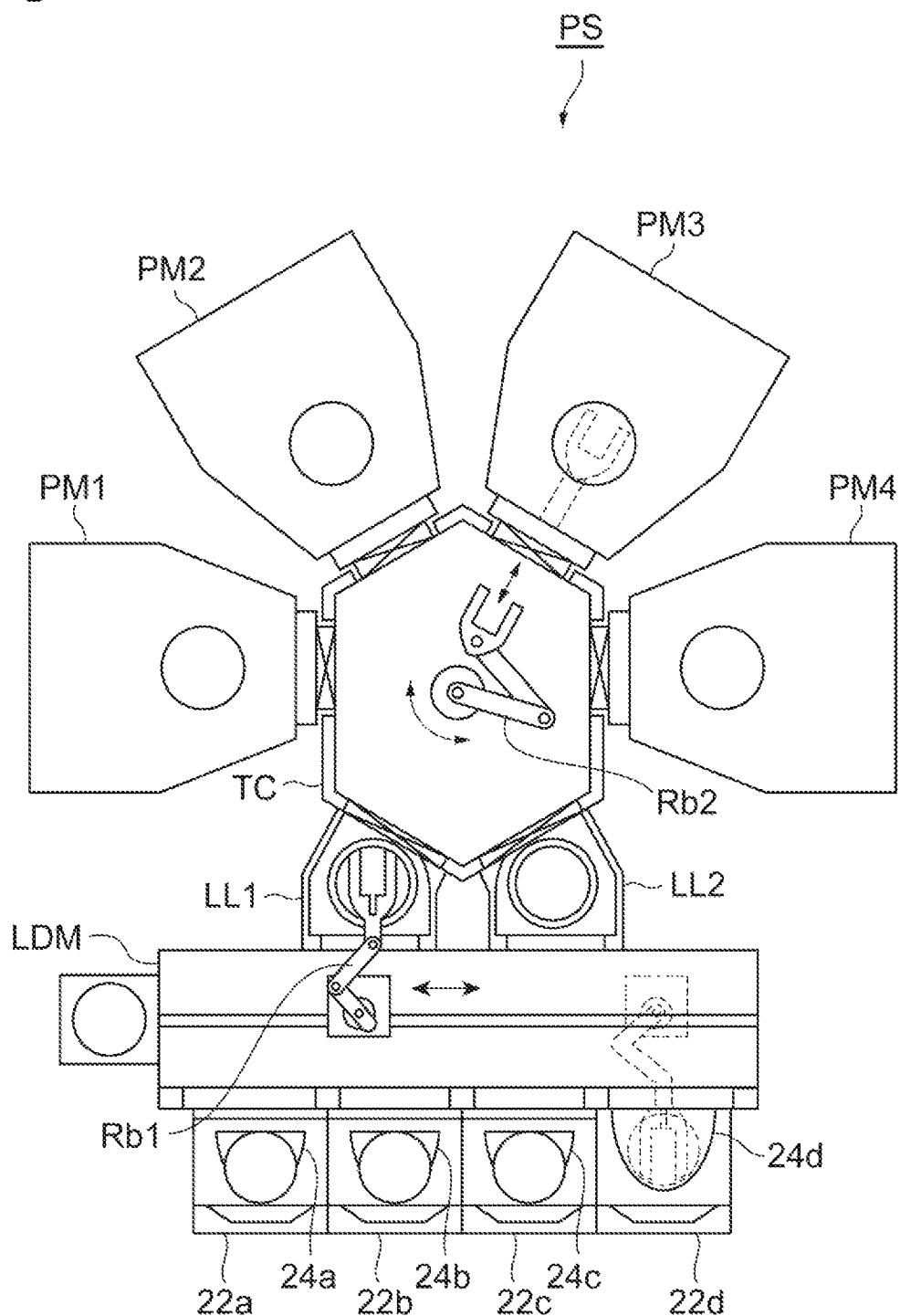
FIG. 7 is a view schematically illustrating a processing system of one embodiment which can be used for execution of the method illustrated in FIG. 1.

Hereinafter, description will be given of a processing system PS that can be used for execution of the method MT. FIG. 7 is a view schematically illustrating a processing system of one embodiment which can be used for execution of the method illustrated in FIG. 1. A processing system PS illustrated in FIG. 7 includes substrate loading stages 22a to 22d, accommodation containers 24a to 24d, a loader module LDM, a load lock chamber LL1, a load lock chamber LL2, a process module PM1, a process module PM2, a process module PM3, a process module PM4, and a transfer chamber TC.

The substrate loading stages 22a to 22d are arranged along an edge of the loader module LDM. The accommodation containers 24a to 24d are loaded on the substrate loading stages 22a to 22d, respectively. The wafer W is accommodated in the accommodation containers 24a to 24d.

A transfer robot Rb1 is provided in the loader module LDM. The transfer robot Rb1 takes out the wafer W that is accommodated in any one of the accommodation containers 24a to 24d, and transfers the wafer W to the load lock chamber LL1 or the load lock chamber LL2.

The load lock chamber LL1 and the load lock chamber LL2 are provided along another edge of the loader module LDM, and comprises preliminary decompression chambers. The load lock chamber LL1 and the load lock chamber LL2 are connected to the transfer chamber TC through gate valves.

The transfer chamber TC is a chamber that can be depressurized, and another transfer robot Rb2 is provided in the chamber. The process modules PM1 to PM4 are connected to the transfer chamber TC through respective gate valves. The transfer robot Rb2 transfers the wafer W between any one of the load lock chamber LL1 and the load lock chamber LL2 and any one of the process modules PM1 to PM4, or between arbitrary two process modules among the process modules PM1 to PM4.

The process module PM1 of the processing system PS is a plasma processing apparatus that can be used for plasma etching, and the process module PM2 is a plasma processing apparatus that can be used for execution of the plasma etching and the step ST3. The process module PM3 is a film forming apparatus that can be used for execution of the step ST4. As the film forming apparatus, a chemical vapor deposition (CVD) apparatus, or a radial line slot antenna (RLSA) apparatus can be used. In addition, the process module PM4 is a plasma processing apparatus that can be used for execution of the plasma etching and the step ST5. Hereinafter, an example of the process module PM1, the process module PM2, and the process module PM4 will be described in detail.

Figure 8:
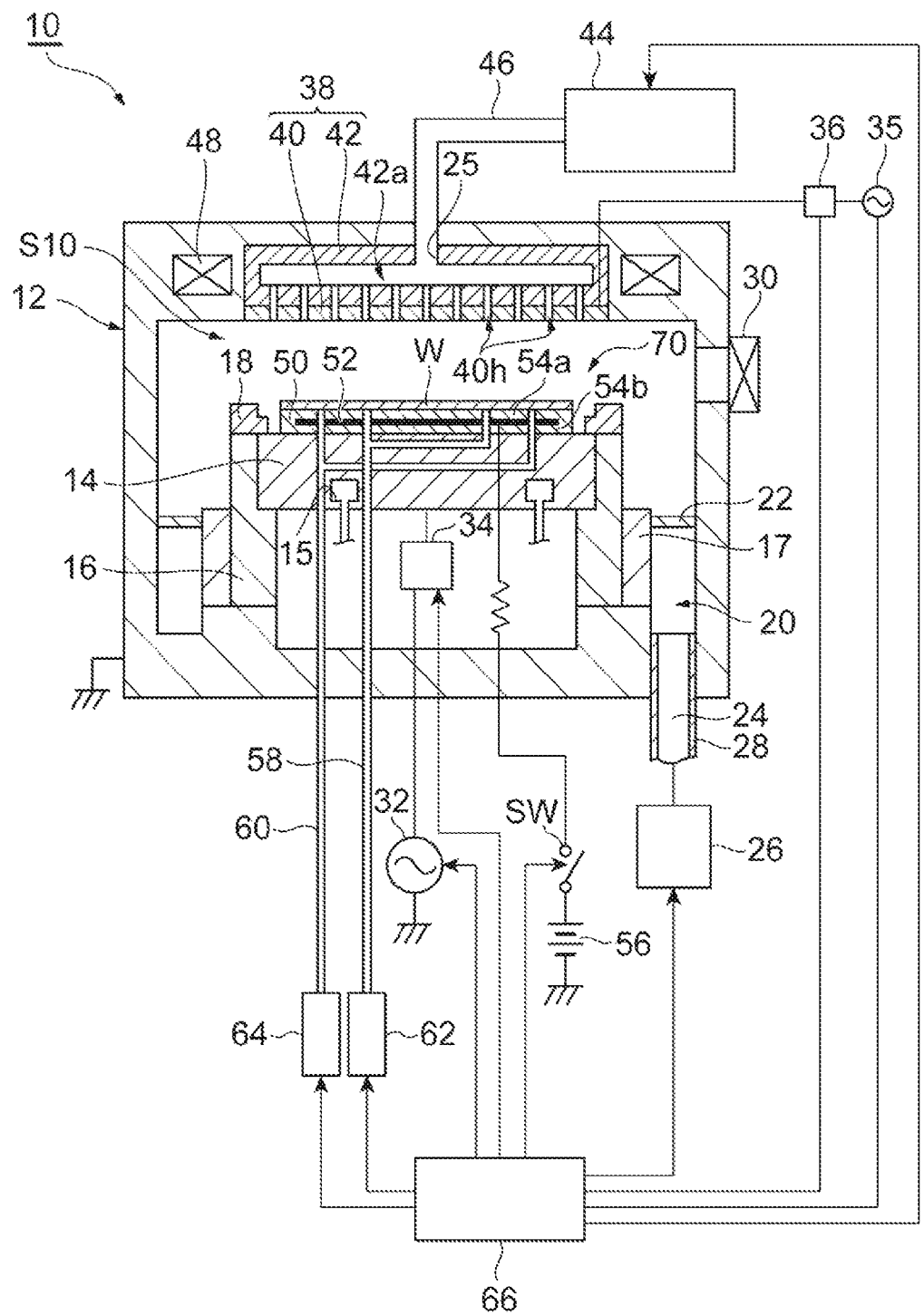
FIG. 8 is a view schematically illustrating a plasma processing apparatus that can be used as a process module PM1 illustrated in FIG. 7.

FIG. 8 is a view schematically illustrating a plasma processing apparatus that can be used as the process module PM1 illustrated in FIG. 7. A plasma processing apparatus 10 illustrated in FIG. 8 includes a processing container 12. The processing container 12 has an substantially cylindrical shape, and provides a processing space S10 as an internal space thereof.

The plasma processing apparatus 10 includes a base 14 having an substantially discoid shape, at the inside of the processing container 12. The base 14 is provided in a region on a lower side in the processing space S10. For example, the base 14 is formed from aluminum and constitutes a lower electrode. The base 14 has a function of cooling down an electrostatic chuck 50, which will be described later, by absorbing heat of the electrostatic chuck 50.

Specifically, a coolant flow passage 15 is formed at the inside of the base 14, and a coolant inlet pipe and a coolant output pipe are connected to the coolant flow passage 15. A coolant is supplied to the coolant flow passage 15 from a chiller unit through the coolant inlet pipe. A coolant that is supplied to the coolant flow passage 15 is returned to the chiller unit through the coolant outlet pipe. According to this configuration, the temperature of the base 14 and the electrostatic chuck 50 is adjusted.

The plasma processing apparatus 10 further includes a tubular holding unit 16 and a tubular support unit 17. The tubular holding unit 16 comes into contact with edges of a lateral surface and a bottom surface of the base 14 and holds the base 14. The tubular support unit 17 extends in a vertical direction from the bottom of the processing container 12, and supports the base 14 through the tubular holding unit 16. The plasma processing apparatus 10 further includes a focus ring 18 that is loaded on an upper surface of the tubular holding unit 16. For example, the focus ring 18 can be formed of silicon or quartz.

An exhaust path 20 is formed between a side wall of the processing container 12 and the tubular support unit 17. A baffle plate 22 is attached at an inlet of the exhaust path 20 or in the middle of the exhaust path 20. In addition, an exhaust port 24 continues from a lower side of the exhaust path 20. The exhaust port 24 is provided by an exhaust pipe 28 that is fitted into the bottom of the processing container 12. An exhaust device 26 is connected to the exhaust pipe 28. The exhaust device 26 includes a vacuum pump, and can reduce a pressure inside the processing space S10 of the processing container 12 to a desired vacuum degree. An opening for transferring-in and transferring-out of the wafer W is provided in the side wall of the processing container 12. A gate valve 30, which opens and closes the opening, is attached to the side wall of the processing container 12.

A high-frequency power supply 32 for generation of plasma is electrically connected to the base 14 through a matching unit 34. The high-frequency power supply 32 supplies a high-frequency electricity mainly for attracting ions, that is, high-frequency bias electricity to a lower electrode, that is, the base 14. For example, a frequency of the high-frequency bias electricity is 400 KHz.

The plasma processing apparatus 10 further includes a shower head 38. The shower head 38 is provided on an upper side of the processing space S10. The shower head 38 includes an electrode plate 40 and an electrode support 42.

The electrode plate 40 is a conductive plate having an substantially discoid shape, and constitutes an upper electrode. The high-frequency power supply 35 is electrically connected to the electrode plate 40 through the matching unit 36. The high-frequency power supply 35 supplies a high-frequency electricity for mainly generation of plasma to the electrode plate 40. A frequency of the high-frequency electricity is, for example, 60 MHz. In the plasma processing apparatus 10, when high-frequency electricity is given to the electrode plate 40 by the high-frequency power supply 35, a high-frequency electric field is formed between the base 14 and the electrode plate 40. Furthermore, the high-frequency power supply 35 may be electrically connected to the base 14 through the matching unit 36.

A plurality of gas ventilation holes 40h are formed in the electrode plate 40. The electrode plate 40 is detachably supported by the electrode support 42. A buffer chamber 42a is provided at the inside of the electrode support 42. The plasma processing apparatus 10 further includes a gas supply source 44, and the gas supply source 44 is connected to a gas inlet port 25 of the buffer chamber 42a through a gas supply conduit 46. The gas supply source 44 supplies a processing gas into the processing space S10.

A plurality of holes, which are communicated with the respective gas ventilation holes 40h, are formed in the electrode support 42, and the plurality of holes communicate with the buffer chamber 42a. Accordingly, a gas, which is supplied from the gas supply source 44, is supplied into the processing space S10 through the buffer chamber 42a and the gas ventilation holes 40h. It should be noted that a flow rate of the processing gas with respect to a central region of the wafer W and a flow rate of the processing gas in a peripheral region of the wafer W may be controlled, in order to control a radical distribution.

In one embodiment, a magnetic-field formation mechanism 48, which extends annularly or concentrically, is provided in the ceiling of the processing container 12. The magnetic-field formation mechanism 48 functions to facilitate initiation (plasma ignition) of high-frequency discharge in the processing space S10 and to stably maintain the discharge.

In one embodiment, the electrostatic chuck 50 is provided on the base 14. The electrostatic chuck 50 includes an electrode 52, and a pair of insulating films 54a and 54b. The insulating films 54a and 54b are films which are formed from an insulating substance such as ceramic. The electrode 52 is a conductive film, and is provided between the insulating film 54a and the insulating film 54b. A DC power supply 56 is connected to the electrode 52 through a switch SW. When a DC voltage is given to the electrode 52 from the DC power supply 56, Coulomb force is generated, and the wafer W is attracted and held on the electrostatic chuck 50 by the Coulomb force. In one embodiment, a heater that is a heating element is embedded at the inside of the electrostatic chuck 50 to heat the wafer W at a predetermined temperature. The heater is connected to a heater power supply through a wiring. The base 14 and the electrostatic chuck 50 constitute a loading stage 70.

In one embodiment, the plasma processing apparatus 10 further includes gas supply lines 58 and 60, and heat-transfer gas supply sources 62 and 64. The heat-transfer gas supply source 62 is connected to the gas supply line 58. The gas supply line 58 extends to an upper surface of the electrostatic chuck 50 and is opened at the central portion of the upper surface. For example, the heat-transfer gas supply source 62 supplies a heat-transfer gas such as He gas between the upper surface of the electrostatic chuck 50 and the wafer W. In addition, the heat-transfer gas supply source 64 is connected to the gas supply line 60. The gas supply line 60 extends to the upper surface of the electrostatic chuck 50, and is opened in a peripheral edge region of the upper surface. For example, the heat-transfer gas supply source 64 supplies a heat-transfer gas such as the He gas between the upper surface of the electrostatic chuck 50 and the wafer W.

In one embodiment, the plasma processing apparatus 10 further includes a control unit 66. The control unit 66 is connected to the exhaust device 26, the switch SW, the high-frequency power supply 32, the matching unit 34, the high-frequency power supply 35, the matching unit 36, the gas supply source 44, and the heat-transfer gas supply sources 62 and 64. The control unit 66 transmits control signals to the exhaust device 26, the switch SW, the high-frequency power supply 32, the matching unit 34, the high-frequency power supply 35, the matching unit 36, the gas supply source 44, and the heat-transfer gas supply sources 62 and 64, respectively. Exhausting by the exhaust device 26, opening and closing of the switch SW, supply of the electricity from the high-frequency power supply 32, impedance adjustment of the matching unit 34, supply of the electricity from the high-frequency power supply 35, impedance adjustment of the matching unit 36, supply of a processing gas by the gas supply source 44, and supply of a heat-transfer gas by each of the heat-transfer gas supply sources 62 and 64 are controlled by the control signals transmitted from the control unit 66.

In the plasma processing apparatus 10, a processing gas is supplied from the gas supply source 44 into the processing space S10. In addition, a high-frequency electric field is formed between the electrode plate 40 and the base 14. The high-frequency electric field generates a plasma in the processing space S10. Then, processing of the wafer W is performed by radicals and/or the likes of elements that are contained in the processing gas.

Figure 9:
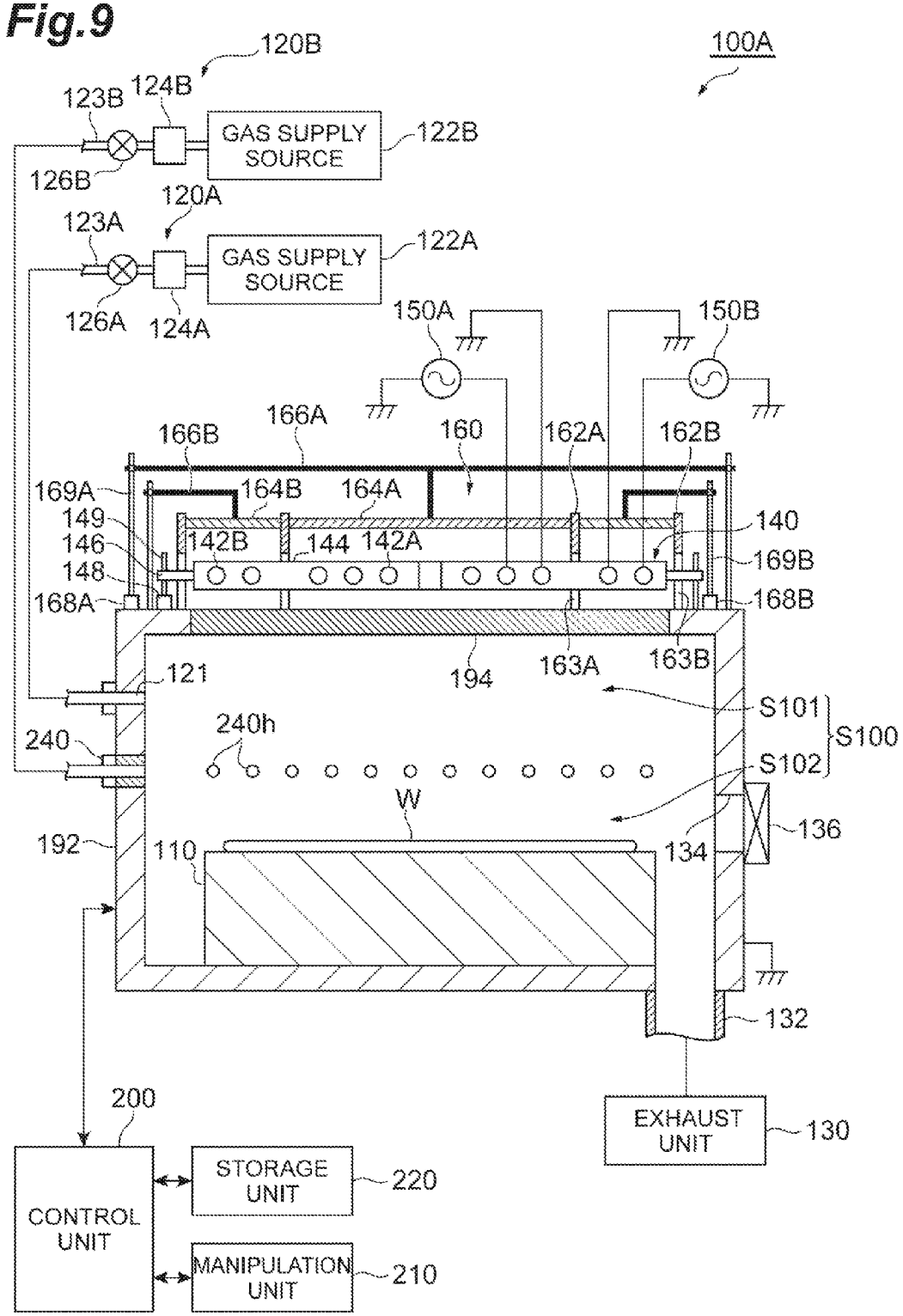
FIG. 9 is a view schematically illustrating a plasma processing apparatus that can be used as a process module PM2 illustrated in FIG. 7.

Hereinafter, description will be given of a plasma processing apparatus 100A that can be used as the process module PM2. FIG. 9 is a view schematically illustrating a plasma processing apparatus that can be used as the process module PM2 illustrated in FIG. 7. The plasma processing apparatus 100A illustrated in FIG. 9 includes a processing container 192. For example, the processing container 192 has a cylindrical shape, and is constituted by a metal such as aluminum. The processing container 192 provides a space S100 as an internal space thereof. The space S100 includes a space S101 and a space S102. The space S101 is a space on an upper side in comparison to the space S102.

A loading stage 110 on which the wafer W is loaded is provided on the bottom of the processing container 192. The loading stage 110 may have an electrostatic chuck on a base formed from a metal such as aluminum. The loading stage 110 may include a temperature adjustment mechanism such as a heater and a coolant flow passage, and the like.

A dielectric body 194 is provided in the ceiling of the processing container 192. The dielectric body 194 has a plate shape, and is constituted by, for example, quartz glass, ceramic, and the like. The dielectric body 194 is provided to face the loading stage 110. For example, the dielectric body 194 is air-tightly provided to close an opening that is formed in the ceiling of the processing container 192.

A first gas supply unit 120A, which introduces a processing gas, is connected to the processing container 192. The first gas supply unit 120A supplies a processing gas, which is excited by a plasma source, into the space S101. A gas inlet port 121 is formed in a side wall of the processing container 192, which defines the space S101, and a gas supply source 122A is connected to the gas inlet port 121 through a gas supply pipe 123A. A flow rate control unit that controls a flow rate of the processing gas, for example, a mass flow controller 124A and an on-off valve 126A are provided in the middle of the gas supply pipe 123A. According to the first gas supply unit 120A, the processing gas supplied from the gas supply source 122A is controlled to a predetermined flow rate by the mass flow controller 124A, and is introduced from the gas inlet port 121 into the space S101 inside the processing container 192.

In addition, a second gas supply unit 120B is connected to the processing container 192. The second gas supply unit 120B supplies a processing gas, of which excitation by a plasma source is to be suppressed, into the space S102. A gas supply head 240 is provided in the side wall of the processing container 192, which defines the space S102. A gas supply source 122B is connected to the gas supply head 240 through a gas supply pipe 123B. The gas supply head 240 provides a plurality of gas holes 240h. The plurality of gas holes 240h may open downward, that is, a direction toward the loading stage 110. Flowing the processing gas downward as described above enables the processing gas to be appropriately supplied to the wafer W. It should be noted that the plurality of gas holes 240h may open upward, that is, in a direction toward the space S101.

A flow rate controller unit that controls a flow rate of the processing gas, for example, a mass flow controller 124B and an on-off valve 126B are provided in the middle of the gas supply pipe 123B. According to the second gas supply unit 120B, the processing gas supplied from the gas supply source 122B is controlled to a predetermined flow rate by the mass flow controller 124B, and is introduced from the gas supply head 240 into the space S102 inside the processing container 192.

An exhaust unit 130, which exhausts a gas in the processing container 192, is connected to the bottom of the processing container 192 through an exhaust pipe 132. For example, the exhaust unit 130 is comprised of a vacuum pump, and is configured to be able to reducing a pressure of the space inside the processing container 192 to a predetermined pressure.

A wafer transfer-in/our port 134 is formed in the side wall of the processing container 192. In addition, a gate valve 136, which opens and closes the wafer tranfer-in/out port 134, is provided in the side wall of the processing container 192.

An antenna 140 and a shield member 160 are provided on an upper side of the ceiling of the processing container 192. The antenna 140 is a high-frequency antenna having a planar shape, and is provided on an upper side of an upper surface (outer surface) of the dielectric body 194. The shield member 160 covers the antenna 140. The antenna 140 includes an inner antenna element 142A and an outer antenna element 142B. The inner antenna element 142A is disposed on an upper side of the central portion of the dielectric body 194. The outer antenna element 142B is disposed on an outer side of the inner antenna element 142A to surround the inner antenna element 142A. For example, each of the inner antenna element 142A and the outer antenna element 142B is formed of a conductor such as copper, aluminum, or stainless steel, and is formed in a spiral coil shape.

Each of the inner antenna element 142A and the outer antenna element 142B is held by a plurality of holders 144 and is integrally formed therewith. For example, each of the plurality of holders 44 is formed in a rod shape. The plurality of holders 144 are radially arranged to protrude from the vicinity of the center of the inner antenna element 142A to an outer side of the outer antenna element 142B.

The shield member 160 includes an inner shield wall 162A and an outer shield wall 162B. The inner shield wall 162A has an substantially tubular shape, and is provided between the inner antenna element 142A and the outer antenna element 142B to surround the inner antenna element 142A. The outer shield wall 162B has an substantially tubular shape, and is provided to surround the outer antenna element 142B. Accordingly, the upper surface of the dielectric body 194 is divided into a central portion (central zone) on an inner side of the inner shield wall 162A, and a peripheral portion (peripheral zone) between the inner shield wall 162A and the outer shield wall 162B.

An inner shield plate 164A having a discoid shape is provided on the inner antenna element 142A to close an opening of the inner shield wall 162A. An outer shield plate 164B having an annular plate shape is provided on the outer antenna element 142B to close an opening between the inner shield wall 162A and the outer shield wall 162B.

It should be noted that the shape of the shield member 160 is not limited to a cylindrical shape. For example, in a case where the shape of the processing container 192 is a square tube shape, the shape of the shield member 160 may be set to another shape such as the square tube shape.

A high-frequency power supply 150A and a high-frequency power supply 150B are connected to the inner antenna element 142A and the outer antenna element 142B, respectively. Accordingly, high-frequency electricities of the same frequency or frequencies different from each other are supplied to the inner antenna element 142A and the outer antenna element 142B. For example, when a high-frequency electricity of a predetermined frequency (for example, 40 MHz) is supplied from the high-frequency power supply 150A to the inner antenna element 142A at predetermined power, a processing gas, which is introduced into the processing container 192, is excited by an induction magnetic field formed in the processing container 192, and a plasma having a doughnut shape is generated at the central portion on the wafer W.

In addition, when a high-frequency electricity of a predetermined frequency (for example, 60 MHz) is supplied from the high-frequency power supply 150B to the outer antenna element 142B at predetermined power, the processing gas, which is introduced into the processing container 192, is excited by an induction magnetic field formed in the processing container 192, and another plasma having a doughnut shape is generated at the peripheral portion on the wafer.

Radicals are generated from the processing gas by the plasma. high-frequency waves output from the high-frequency power supply 150A and the high-frequency power supply 150B is not limited to the above-described frequencies. For example, high-frequency electricities of various frequencies such as 13.56 MHz, 27 MHz, 40 MHz, and 60 MHz may be supplied. It should be however noted that the electrical length of the inner antenna element 142A and the outer antenna element 142B may be adjusted in accordance with the high-frequency electricities output from the high-frequency power supply 150A and the high-frequency power supply 150B. In addition, a position of the inner shield plate 164A in a height direction and a position of the outer shield plate 164B in a height direction are set to be controlled by an actuator 168A and an actuator 168B, respectively.

The plasma processing apparatus 100A further includes a control unit 200. Respective portions of the plasma processing apparatus 100A are controlled by the control unit 200. In addition, an manipulation unit 210 is connected to the control unit 200. The manipulation unit 210 includes a keyboard with which an operator performs a command input operation in order to manage the plasma processing apparatus 100A, a display that visually displays an operation situation of the plasma processing apparatus 100A, and the like.

In addition, a storage unit 220 is connected to the control unit 200. The storage unit 220 stores a program for execution of various kinds of processing, which are executed in the plasma processing apparatus 100A, by control of the control unit 200, recipe data necessary for execution of the program, and the like.

For example, the storage unit 220 stores a recipe for execution of necessary processing such as cleaning processing for the inside of the processing container 192, and the like in addition to a plurality of process processing recipes for execution of process processing of the wafer W. The recipe collectively represents a plurality of parameter values such as control parameters and setting parameters for control of respective portions of the plasma processing apparatus 100A. For example, the process processing recipes include parameter values such as flow rates of processing gases, a pressure inside the processing container 192, and frequencies and powers of the high-frequency electricities that are supplied to the inner antenna element 142A and the outer antenna element 142B.

Figure 10:
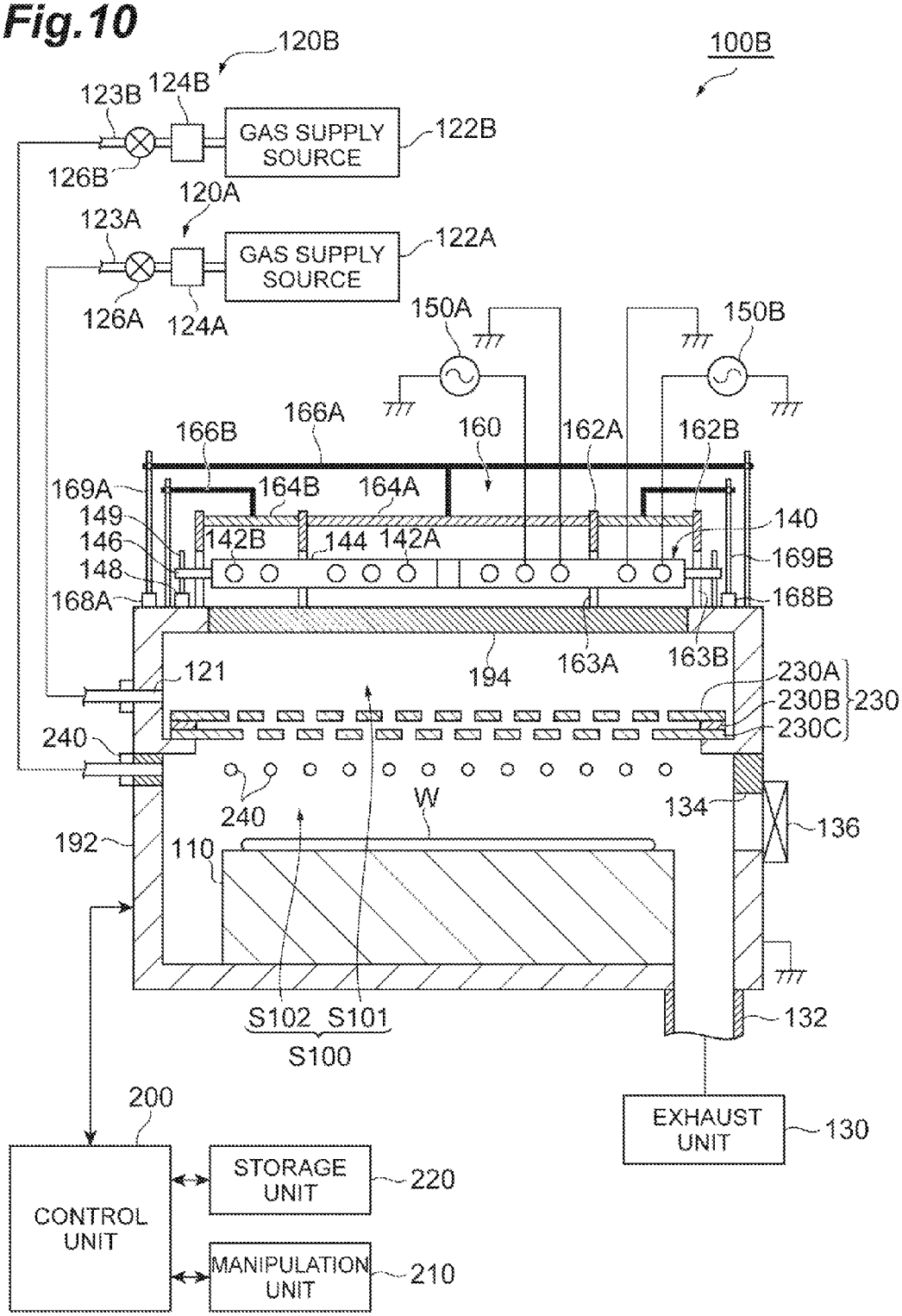
FIG. 10 is a view schematically illustrating a plasma processing apparatus that can be used as a process module PM4 illustrated in FIG. 7.

Hereinafter, description will be given of a plasma processing apparatus 100B that can be used as the process module PM4. FIG. 10 is a view schematically illustrating a plasma processing apparatus that can be used as the process module PM4 illustrated in FIG. 7.

The plasma processing apparatus 100B is different from the plasma processing apparatus 100A in that a partition plate 230 is provided. The partition plate 230 is provided at the inside of the processing container 192. The partition plate 230 is provided between the space S101 and the space S102 to partition the space S101 and the space 102 from each other. In the plasma processing apparatus 100B, the space S101 is a space in which a plasma is generated by a plasma source. The space S102 is a space in which the wafer W is disposed. The partition plate 230 includes at least two plate-shaped members, that is, a plate-shaped member 230A and a plate-shaped member 230C. The plate-shaped member 230A and the plate-shaped member 230C are arranged in order in a direction toward the space S102 from the space S101. A spacer 230B, which maintains an interval between the plate-shaped member 230A and the plate-shaped member 230C to a predetermined interval, is disposed between the plate-shaped member 230A and the plate-shaped member 230C.

A plurality of slits are formed to pass through the plate-shaped member 230A and the plate-shaped member 230C in the arrangement direction of the plate-shaped member 230A and the plate-shaped member 230C. It should be noted that the slits may be through-holes. The slits, which are formed in the plate-shaped member 230A, are arranged so as not to overlap the slits which are formed in the plate-shaped member 230C when seen in the arrangement direction. For example, as a material of the plate-shaped members 230A and 230C, quartz glass is used. For example, as a material of the spacer 230B, aluminum (Al) is used. The partition plate 230 configured as described above functions as a so-called ion trap that suppresses transmission of an ion and vacuum ultraviolet light. It should be noted that, in a state where depressurization of the space S100 is performed by the exhaust unit 130, radicals generated in the space S101 can move from the space S101 to the space S102 after being transmitted through the partition plate 230 due to a pressure difference between the space S101 and the space S102.

Hereinafter, description will be given of various embodiments with regard to an operation of the processing system PS in a case of executing the method MT in the processing system PS that includes the plasma processing apparatus 10, the plasma processing apparatus 100A, and the plasma processing apparatus 100B as the process module PM1, the process module PM2, and the process module PM4.

In one embodiment, the step ST1 and the step ST2 are sequentially executed by using the plasma processing apparatus 10. In the step ST1, a processing gas for etching of the mask layer ML is supplied into the processing container 12 of the plasma processing apparatus 10 in which the wafer W illustrated in FIG. 2A is accommodated, and a plasma of the processing gas is generated. In the step ST2, the processing gas A is supplied into the processing container 12 of the plasma processing apparatus 10, and a plasma of the processing gas A is generated.

Subsequently, the wafer W is transferred to the plasma processing apparatus 100A. Then, the step ST3 is executed by using the plasma processing apparatus 100A. It should be noted that, in one embodiment, a pressure inside a space in which the wafer W is disposed in the step ST3 is set to be higher than a pressure inside a space in which the wafer W is disposed in the step ST2. For example, the pressure inside the space in which the wafer W is disposed in the step ST3 is set to a pressure of 1 Torr (133.3 Pa) or greater. For example, in the step ST31, the pressure inside the space in which the wafer W is disposed is set to 5 Torr (666.6 Pa). In the step ST32, the pressure inside the space in which the wafer W is disposed is set to 40 Torr (5333 Pa). In addition, in the step ST3, a temperature of the wafer W is set to be higher than a temperature of the wafer W in the step ST2. For example, in the step ST31 of the step ST3, the temperature of the wafer W is set to a temperature of approximately 200° C. To this end, in the embodiment, after execution of the step ST2, the wafer W is transferred to the plasma processing apparatus 100A for execution of the step ST3.

Before execution of the step ST3, in the plasma processing apparatus 100A, a temperature of the loading stage 110 is set to a high temperature as described above, for example, 200° C. In addition, an inert gas such as Ar gas is supplied into the processing container 192 of the plasma processing apparatus 100A. Subsequently, in the step ST31 of the step ST3, the processing gas B is supplied into the processing container 192 of the plasma processing apparatus 100A from the first gas supply unit 120A, and a plasma of the processing gas B is generated. For example, the processing gas B may contain 150 sccm of $H_2$ gas, 300 sccm of Ar gas, and an $N_2$ gas. A flow rate of the $N_2$ gas may be arbitrarily set. In addition, in the step ST31, powers, which are supplied to an antenna element of the antenna 140 by the high-frequency power supply 150A and the high-frequency power supply 150B, may be set to, for example, 1000 W.

Subsequently, a gas inside the processing container 192 of the plasma processing apparatus 100A is replaced with an inert gas such as Ar gas, and then the step ST32 is executed. In the step ST32, the processing gas C is supplied into the processing container 192 of the plasma processing apparatus 100A from the second gas supply unit 120B. It should be noted that the processing gas C is not excited in the step ST32, and thus a plasma is not generated in the step ST32. For example, the processing gas C can contain 280 sccm of hfacH, 100 sccm of $H_2O$, and 30 sccm of $O_2$ gas.

After repeating the step ST31 and the step ST32 one by one, or alternately repeating the steps a plurality of times, the wafer W is transferred to the process module PM3. In the process module PM3, the step ST4 is executed. As a result, the protective film PF is formed on the wafer W.

Subsequently, the wafer W is transferred to the plasma processing apparatus 100B. Then, the step ST5 is executed by using the plasma processing apparatus 100B. In the step ST51 of the step ST5, the processing gas D is supplied into the processing container 192 of the plasma processing apparatus 100B from the first gas supply unit 120A, and a plasma of the processing gas D is generated. Subsequently, the step ST52 is executed. In the step ST52, the processing gas E is supplied into the processing container 192 of the plasma processing apparatus 100B from the second gas supply unit 120B.

Subsequently, the wafer W is transferred to the plasma processing apparatus 10. Then, the step ST6 and the step ST7 are sequentially executed by using the plasma processing apparatus 10. In the step ST6, the processing gas F is supplied into the processing container 12 of the plasma processing apparatus 10, and a plasma of the processing gas F is generated. In addition, in the step ST7, the processing gas G is supplied into the processing container 12 of the plasma processing apparatus 10, and a plasma of the processing gas G is generated. As a result, the execution of the method MT is completed, and the MRAM element is manufactured.

In another embodiment, the step ST2, the step ST31, and the step ST32 may be executed by using the plasma processing apparatus 100A. In still another embodiment, at least one of the step ST6 and the step ST7 may be executed by using the plasma processing apparatus 100A.

Hereinbefore, description has been given of various embodiments, but various modifications can be made without limitation to the above-described embodiments. For example, the plasma processing apparatus 100A does not include the partition plate 230. However, the plasma processing apparatus 100A may be provided with, for example, a partition plate including a small number of plate-shaped members in comparison to the plasma processing apparatus 100B. In this case, it is possible to reduce the amount of ions which are supplied to the wafer W.

In addition, in the above-described embodiments, the step ST3 is executed for removal of the deposit that is generated due to etching of the upper magnetic layer, but the step ST3 may be executed for removal of a deposit that is generated due to etching of the lower magnetic layer.

REFERENCE SIGNS LIST

PS: processing system, LDM: Loader module, LL1: Load lock chamber, LL2: Load lock chamber, TC: Transfer chamber, PM1: Process module, PM2: Process module. PM3: Process module, PM4: Process module, 10: Plasma processing apparatus, 12: Processing container, 70: Loading stage, 14: Base, 50: Electrostatic chuck, 26: Exhaust device, 32: High-frequency power supply, 35: High-frequency power supply, 38: Shower head, 44: Gas supply source, 66: Control unit, 100A: Plasma processing apparatus, 100B: Plasma processing apparatus, 192: Processing container, 110: Loading stage, 120A: First gas supply unit, 120B: Second gas supply unit, 130: Exhaust unit, 140: Antenna, 142A: Inner antenna element, 142B: Outer antenna element, 150A: High-frequency power supply, 150B: High-frequency power supply, 194: Dielectric body, 200: Control unit, 230: Partition plate, W: Wafer, SB: Substrate, LE: Lower electrode layer, PL: Pinning layer, LM: Lower magnetic layer, IL: Insulating layer, UM: Upper magnetic layer, UE: Upper electrode layer, ML: Mask layer, MK: Mask, DP: Deposit, RP: Product, PF: Protective film, RP2: Reaction product

The invention claimed is:

1. A method for processing a workpiece which includes a lower magnetic layer, an insulating layer provided on the lower magnetic layer, an upper magnetic layer provided on the insulating layer, and a mask provided on the upper magnetic layer, the method comprising:
   etching the upper magnetic layer, said etching the upper layer including supplying a first processing gas into a processing container of a plasma processing apparatus, and generating a plasma of the first processing gas to etch the upper magnetic layer by the plasma of the first processing gas; and
   removing a deposit that is formed on the workpiece due to said etching the upper magnetic layer,
   wherein said removing the deposit includes,
   allowing a reduction reaction to occur in the deposit by a plasma of a second processing gas containing $H_2$ gas, and
   removing a product, which is generated by the reduction, by using a third processing gas containing hexafluoroacetylacetone.

2. The method according to claim 1,
   wherein said etching the upper magnetic layer and said removing the deposit are alternately repeated.

3. The method according to claim 1,
   wherein the second processing gas further contains $N_2$ gas.

4. The method according to claim 1,
   wherein the third processing gas contains $H_2O$.

5. The method according to claim 1,
   wherein the upper magnetic layer contains CoFeB.

6. The method according to claim 1, further comprising:
   etching the insulating layer, said etching the insulating layer including supplying a fourth processing gas into a processing container of a plasma processing apparatus, and generating a plasma of the fourth processing gas to etch the insulating layer by the plasma of the fourth processing gas.

* * * * *